(12) United States Patent
Weekamp et al.

(10) Patent No.: US 12,120,961 B2
(45) Date of Patent: Oct. 15, 2024

(54) SENSOR COMPRISING AN INTERCONNECT HAVING A CARRIER FILM

(71) Applicant: KONINKLIJKE PHILIPS N.V., Eindhoven (NL)

(72) Inventors: Johannes Wilhelmus Weekamp, Beek en Donk (NL); Roland Alexander Van De Molengraaf, Geldrop (NL); Arjen Van Der Horst, Tilburg (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 603 days.

(21) Appl. No.: 17/428,347

(22) PCT Filed: Jan. 21, 2020

(86) PCT No.: PCT/EP2020/051325
§ 371 (c)(1),
(2) Date: Aug. 4, 2021

(87) PCT Pub. No.: WO2020/160897
PCT Pub. Date: Aug. 13, 2020

(65) Prior Publication Data
US 2022/0131065 A1 Apr. 28, 2022

(30) Foreign Application Priority Data
Feb. 5, 2019 (EP) .................................... 19155417

(51) Int. Cl.
*H01L 41/047* (2006.01)
*B06B 1/06* (2006.01)
(Continued)

(52) U.S. Cl.
CPC ......... *H10N 30/875* (2023.02); *B06B 1/0622* (2013.01); *G10K 11/32* (2013.01); *H10N 30/06* (2023.02); *H10N 30/302* (2023.02)

(58) Field of Classification Search
CPC ...................................................... B06B 1/0622
See application file for complete search history.

(56) References Cited

U.S. PATENT DOCUMENTS 4,686,408 A 8/1987 Ishiyama
2010/0125208 A1* 5/2010 Lee ...................... G10K 11/004
600/459

(Continued)

FOREIGN PATENT DOCUMENTS

EP 0145429 A2 6/1985
EP 0739656 A2 10/1996
(Continued)

OTHER PUBLICATIONS

International Search Report and Written Opinion of PCT/EP2020/051325, dated Apr. 17, 2020.
(Continued)

*Primary Examiner* — Bryan P Gordon

(57) ABSTRACT

The present invention relates to a sensor, comprising a sensor element and an interconnect. The interconnect is configured to be arranged at the sensor element. The interconnect comprises at least a carrier film provided with metallic layer. The interconnect is configured to provide an electrical connection for the sensor element. Furthermore a device comprising the sensor and a method of manufacturing the sensor is provided.

12 Claims, 10 Drawing Sheets

(51) Int. Cl.
*G10K 11/32* (2006.01)
*H10N 30/06* (2023.01)
*H10N 30/30* (2023.01)
*H10N 30/87* (2023.01)

(56) References Cited

U.S. PATENT DOCUMENTS

| 2015/0119718 | A1* | 4/2015 | Jin | B06B 1/0622 |
| | | | | 310/342 |
| 2016/0271651 | A1* | 9/2016 | Petersen | B06B 1/06 |
| 2018/0161816 | A1* | 6/2018 | Kojima | B06B 1/0622 |
| 2018/0287046 | A1* | 10/2018 | Hirai | B06B 1/0207 |

FOREIGN PATENT DOCUMENTS

| EP | 2165650 A1 | 3/2010 |
| EP | 3388155 A1 | 4/2017 |
| WO | 2015093358 A1 | 6/2015 |
| WO | 2015137251 A1 | 9/2015 |

OTHER PUBLICATIONS

Do Nascimento, Valeria M. et al "Influence of Backing and Matching Layers in Ultrasound Transducer performance", Proceedings of the Society of Photo-Optical Instrumentation Engineers, vol. 5035, pp. 86-96, 2003.

* cited by examiner

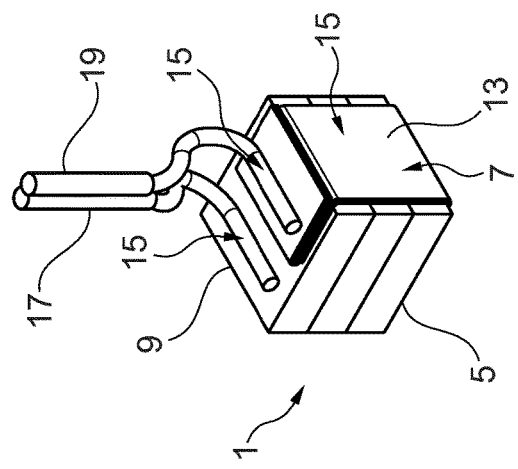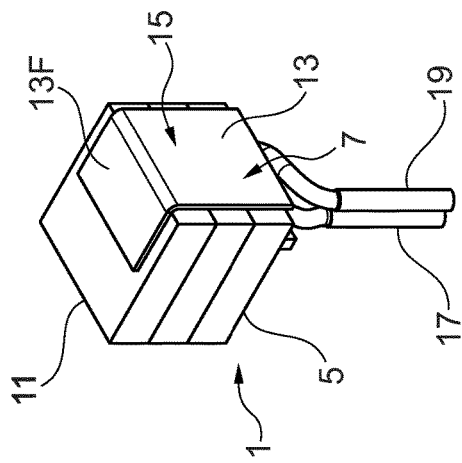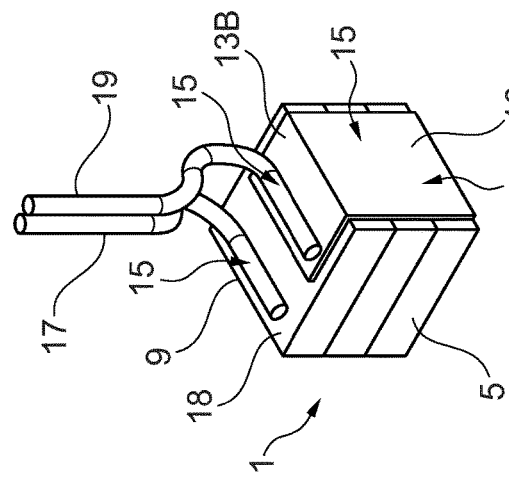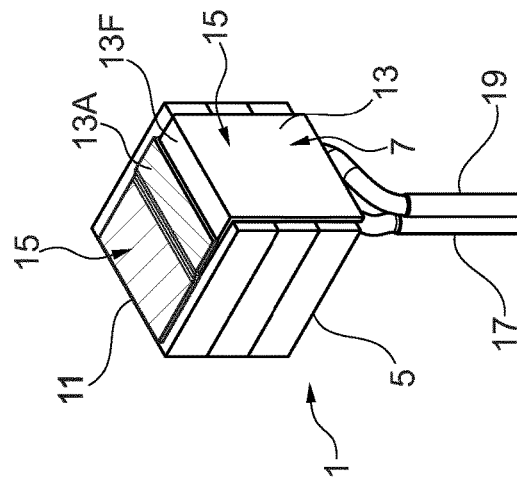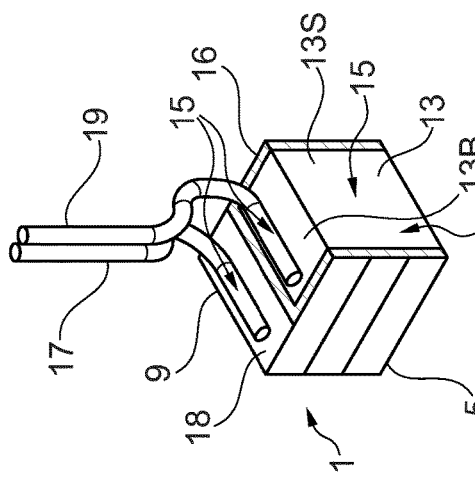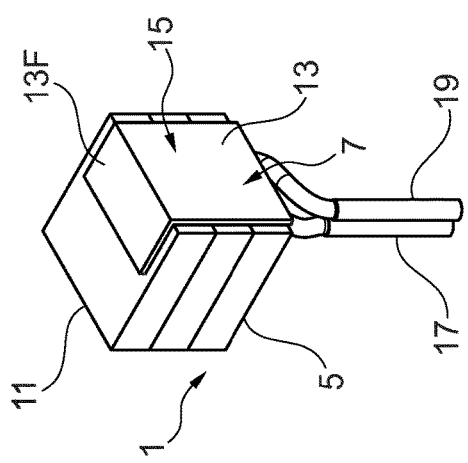

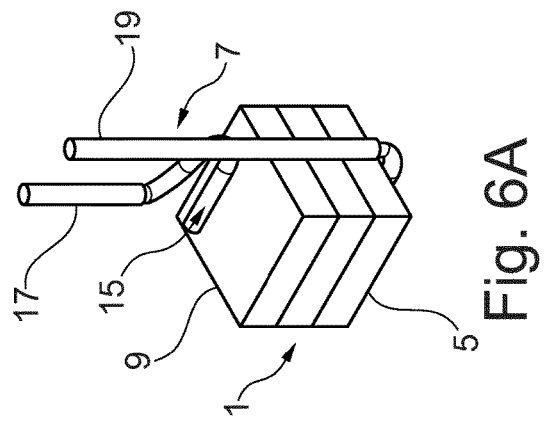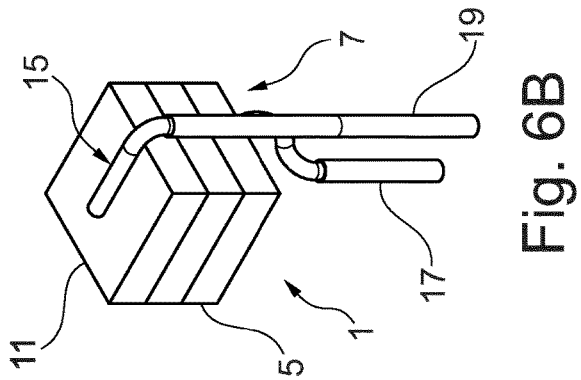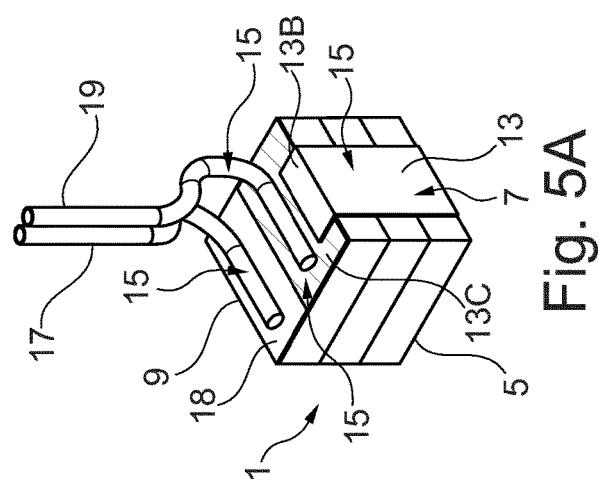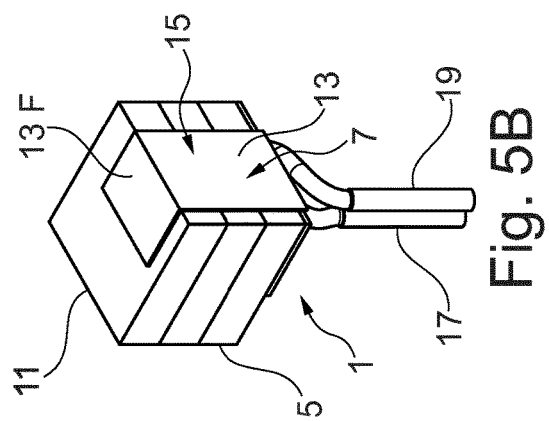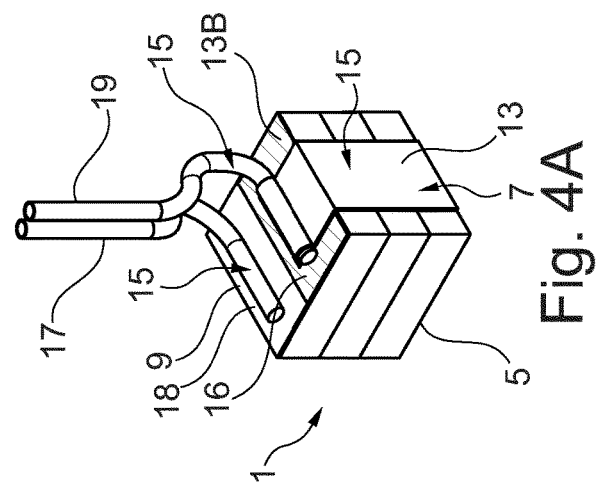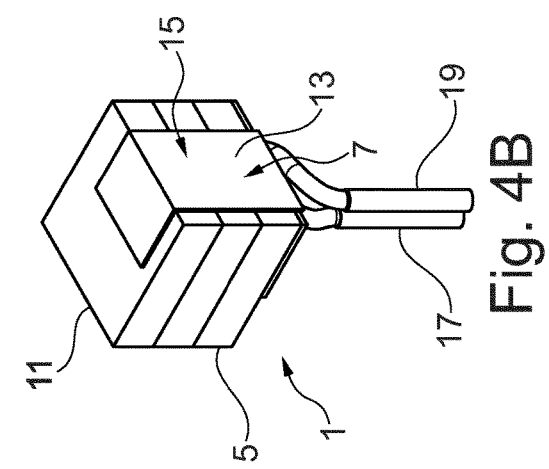

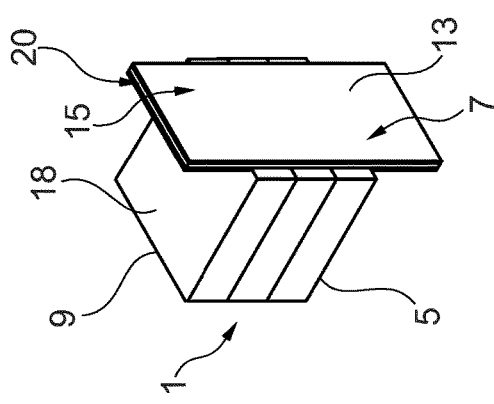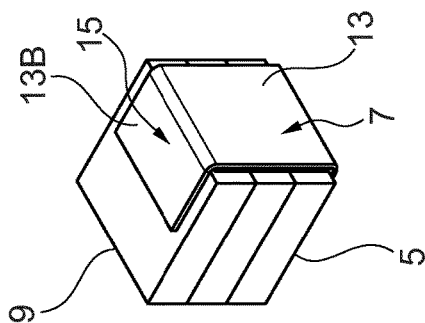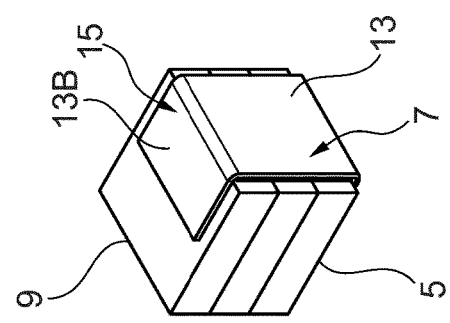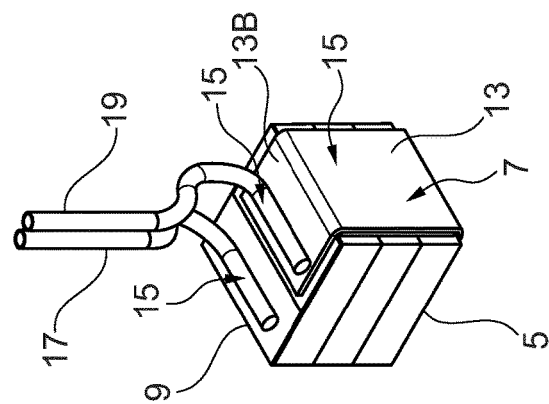
Fig. 7A
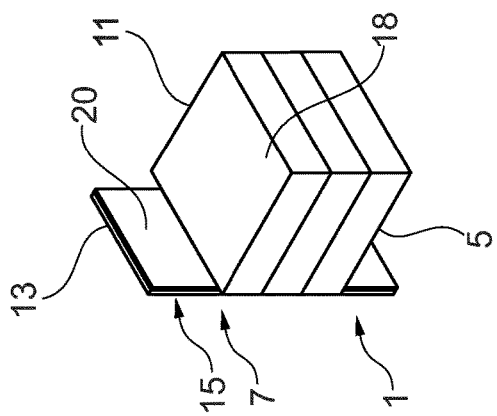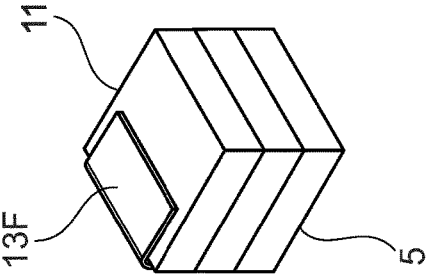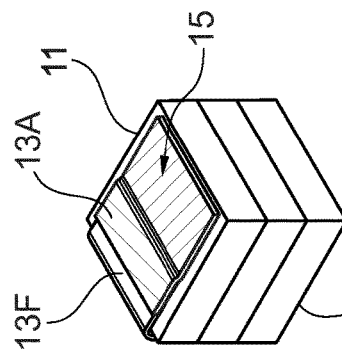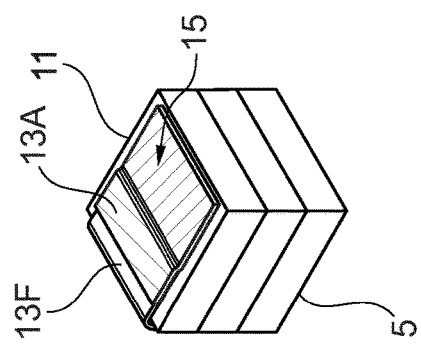
Fig. 7B

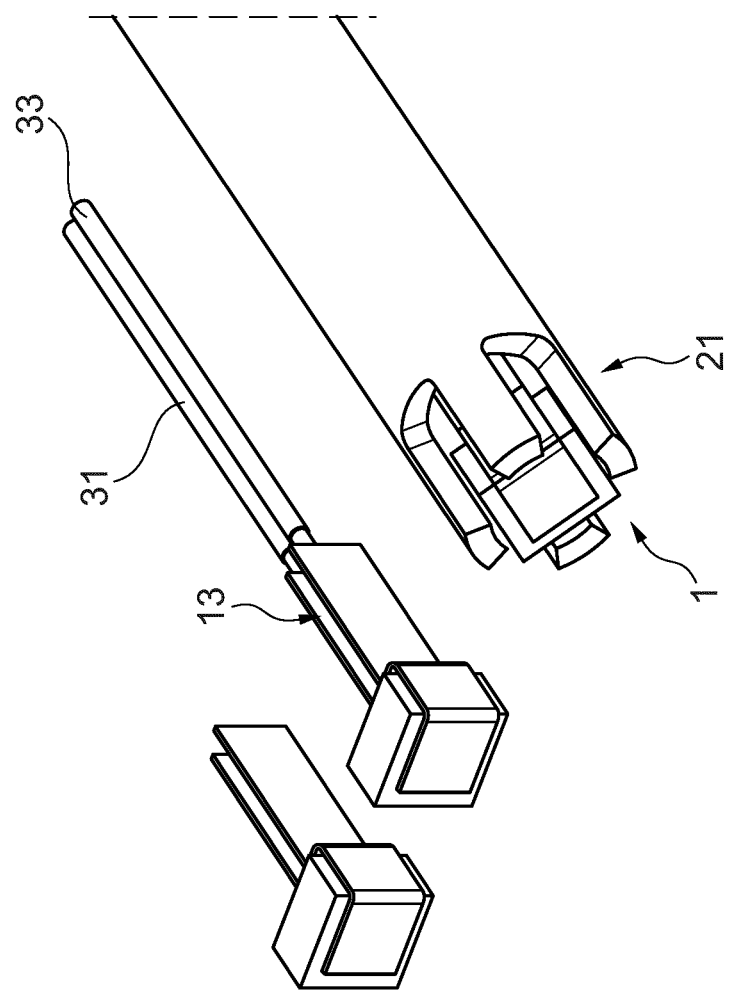
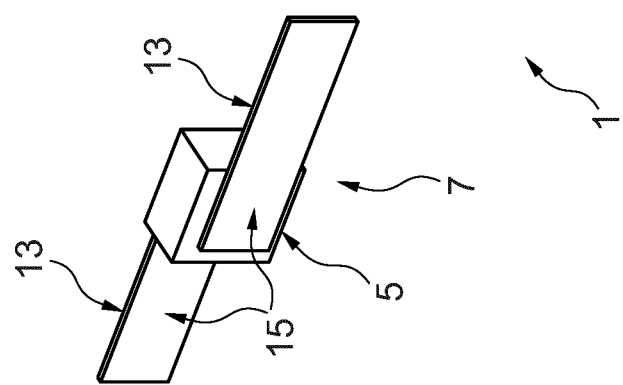
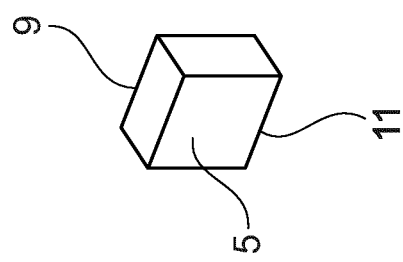
Fig. 11

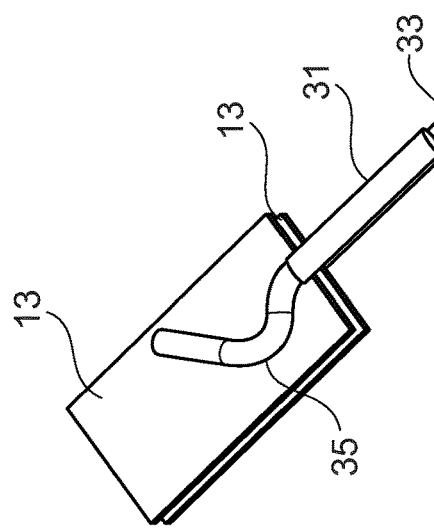
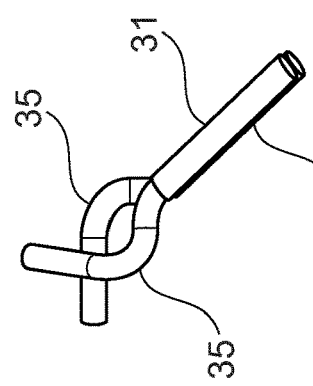
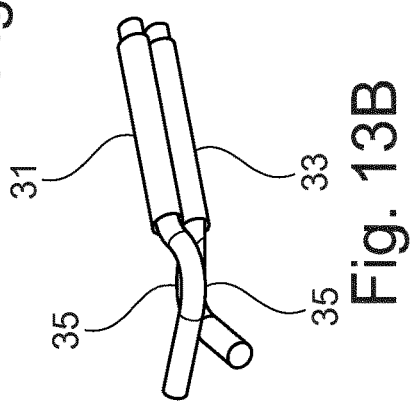
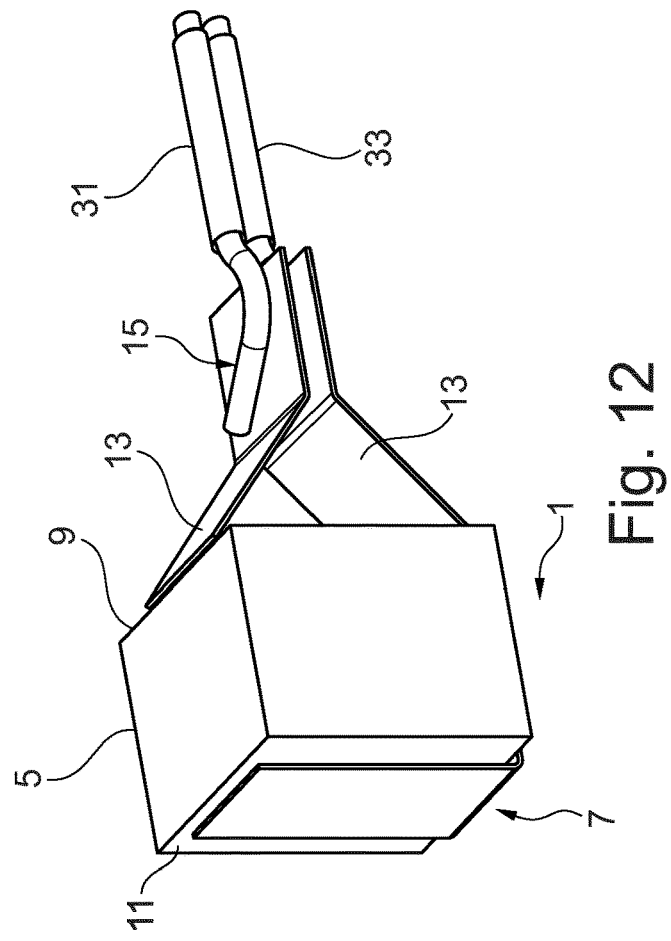

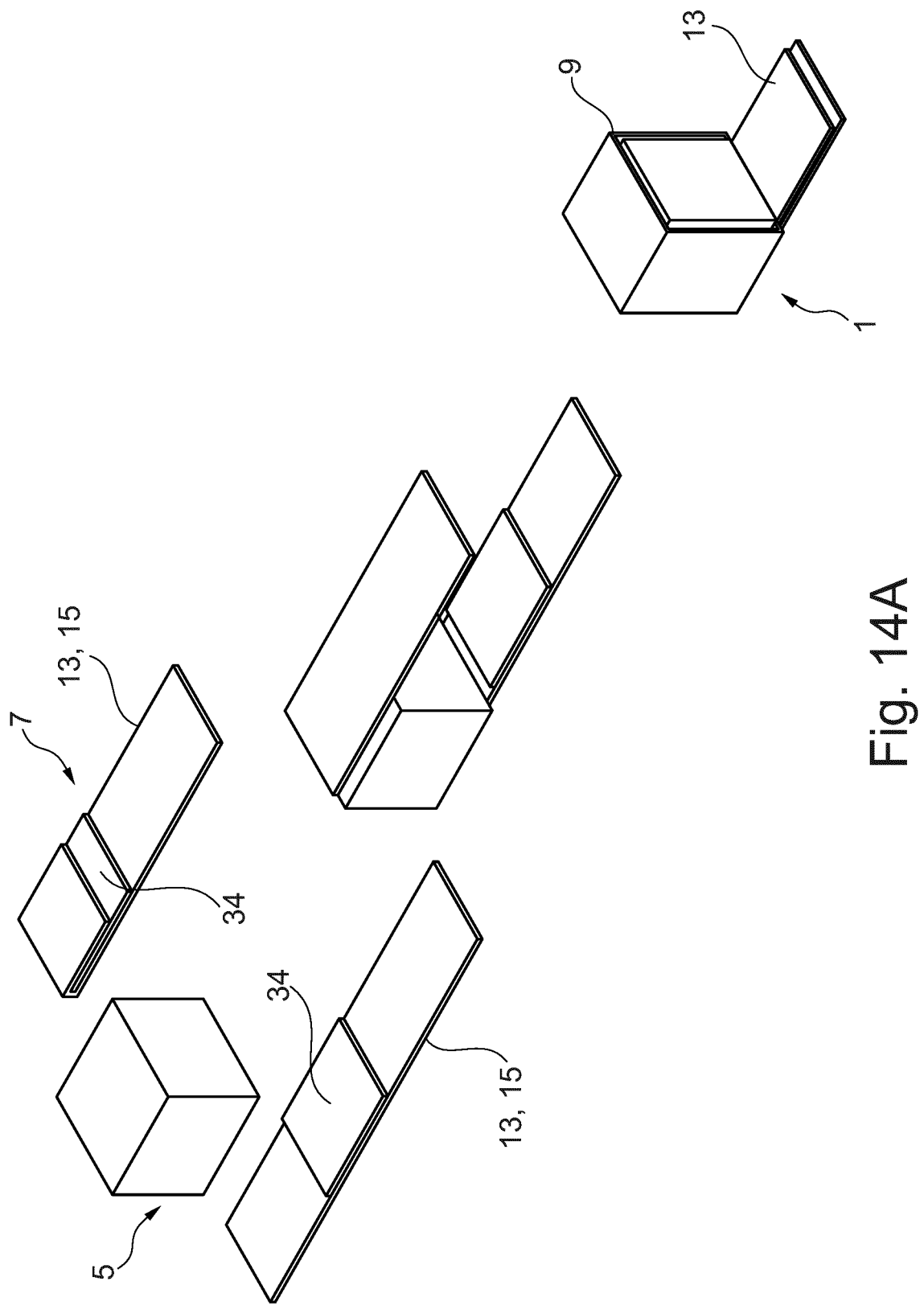

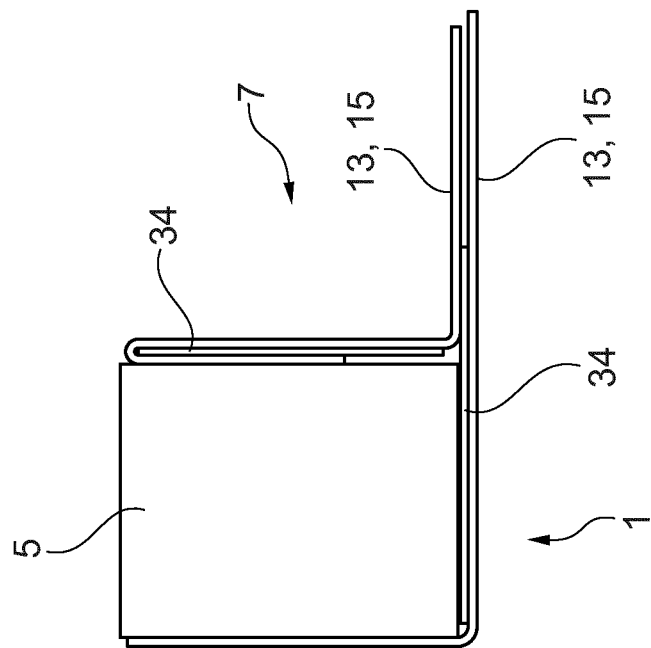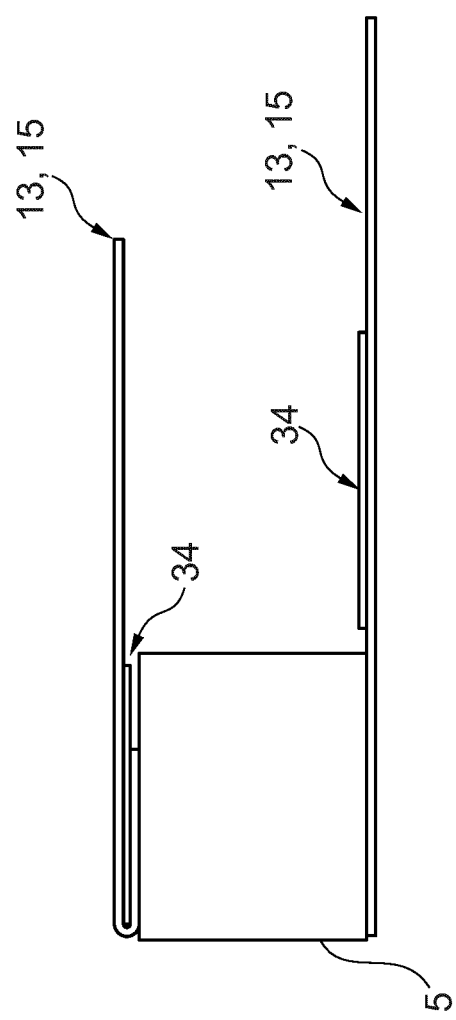
Fig. 14B

SENSOR COMPRISING AN INTERCONNECT HAVING A CARRIER FILM

CROSS-REFERENCE TO PRIOR APPLICATIONS

This application is the U.S. National Phase application under 35 U.S.C. § 371 of International Application No. PCT/EP2020/051325, filed on Jan. 21, 2020, which claims the benefit of European Patent Application No. 19155417.9, filed on Feb. 5, 2019. These applications are hereby incorporated by reference herein.

FIELD OF THE INVENTION

The present invention relates to a sensor, a device comprising the sensor and a method for manufacturing the sensor.

BACKGROUND OF THE INVENTION

Measuring blood flow in arteries helps physicians in making the right diagnoses for proper treatment. The measuring principle can be based on the Doppler effect. The actuator/receiver for such a device can be based on a circular disk of piezo electric material with electrodes on front and back side. The electrical interconnect is made by soldering wires on both front and back surfaces of the piezo disk. This is the current state of the art for intravascular flow sensing. Another application using piezo electric material is for localization of sensors on devices in an ultrasound field (in-situ), where circular disk transducers can be used.

An ultrasonic transducer array and manufacturing method is known from EP0739656 A2. Each transducer element includes a piezoelectric layer and one or more acoustic matching layers. The piezoelectric layer has a concave front surface overlaid by a front electrode and a rear surface overlaid by a rear electrode.

Piezo disks having electrical connection made by soldering wires often have reduced or limited sensitivity and distortion due to the presence of wires and soldering material. The amount of soldering material, which is applied for the electrical connection can limit the transducer resonance performance, at the cost of acoustic pressure output.

A state of the art piezo disk 2 is shown in FIGS. 16A-C. In FIG. 16A the back side of the disk 2 is shown. In FIG. 16B the front side 6 of the same piezo disk 2 is shown. The electrical connection to the front and backsides is made by soldering copper wires: a front wire 8 and a back wire 10 attached to the front side 6 and the back side 4 of the disk 2, respectively. The piezo disk 2 has a hole for the front wire 8 to run through. The quantity of soldering material 3 needed to fix the front wire 8 might cover a substantial part of the front side 6. An exemplary top view of the front side 6 is shown in FIG. 16C, where the solder covers about a quarter of the front side 6.

The amount of solder 3 that is applied on a transducer front surface 6 can influence the transducer resonance performance and acoustic pressure output. Further, there can be a loss of acoustical pressure due to the reduced active surface 6 of the piezo disk.

SUMMARY OF THE INVENTION

There is a need to provide a transducer with improved performance and integration of sensors in medical devices having dimensional constraints.

The object of the present invention is solved by the subject-matter of the independent claims; further embodiments are incorporated in the dependent claims. It should be noted that the following described aspects of the invention apply also for the sensor, the device comprising the sensor and for the method for manufacturing the sensor.

According to the present invention, the sensor comprises a sensor element, an interconnect and a metallic layer. The interconnect is configured to be arranged at the sensor element. The interconnect comprises at least a carrier film provided with the metallic layer and/or at least one wire provided with the metallic layer. The interconnect is configured to provide an electrical connection for the sensor element.

The sensor is used for several medical applications such as for Doppler flow measurement, ultrasound imaging. Furthermore, ultrasound tracking of the sensor by an external ultrasound probe is also provided.

The sensor comprises sensor element(s) for (Doppler) flow measurement, ultrasound imaging or other sensor elements used in medical devices. The sensor comprises an acoustic stack of materials, including active and passive parts. A sensor element is the active part, which generates/receives ultrasound waves. The sensor element can comprise a ceramic disk or a plate of any geometrical form (circular, square, hexagonal, octagonal, etc.). The passive parts of the sensor play a role in coupling acoustic waves effectively into the desired medium.

The passive parts are provided by one or more matching layers in front of the active part, and one or more de-matching layers at the back of the active part. The de-matching layers can comprise backing material for attenuating transmission of ultrasound waves in undesired directions (e.g. proximal shaft of the device). The de-matching layers can comprise non-conducting epoxy material. The active parts can comprise single crystal piezo electric material. The matching layers for efficiently coupling ultrasound waves into a medium in the desired direction (e.g. anatomical structures, various body fluid, etc.).

The sensor element(s) may originate from a piezoelectric ultrasound emitter/sensor array or from a capacitive micromachined ultrasound emitter/sensor array. The sensor element(s) may comprise multiple or single acoustic stack of materials. Ultrasound emitter/receiver elements or transducer elements provide an increased aperture for receiving ultrasound scattering and reflection from anatomical media (structures, fluids) upon impinging ultrasound waves.

The interconnect is arranged at the sensor element. The interconnect comprises at least one of a carrier film and at least one wire. In other words, in examples the interconnect comprises the carrier film and an additional carrier film or sheet of carrier film arranged at the front part or at the back part of the carrier film. In examples the interconnect comprises two wires which are attached at a front side and a back side of the sensor element for electrical connection. In examples the interconnect comprises the carrier film and at least one wire connected thereto, wherein the carrier film may provide a front part, a side part and a back part and/or an additional carrier film or sheet of carrier film arranged at the front part or at the back part of the carrier film. In other words, the carrier film The carrier film comprises PET (Polyethylene Terephthalate), Polypropylene or Polyimide. The thickness of the carrier film is in the range of about 2 to 10 micron, preferably about 6 micron including tolerances. The carrier film also comprises film, foil or other substrates suitable for acoustic functionality. The wire comprises metals, e.g. Copper or Copper Beryllium.

The metallic layer comprises metal, e.g. gold (Au) or other noble metals like platinum (Pt). The metals are provided for making an electrical contact. Au or other noble metals like Pt may be preferred for preventing corrosion. If properly shielded silver (Ag) can also be used. The thickness of the metallic layer is in the rage of about 10 to 500 nanometer preferably about 30 to 50 nanometer (including tolerances).

The carrier film, the wire(s) or both are provided with the metallic layer. The metalized carrier film and/or metallized wires provides an interconnect for sensor element(s), e.g. ultrasound transducer, without compromising its acoustic properties. The metalized film interconnect provided on sensor elements, e.g. piezo electric transducers, on guide wires improves the sensor sensitivity compared to prior art soldered wired devices.

By providing a metalized carrier film and/or metallized wires on the sensor element(s) less attenuation is caused by the interconnect, when arranged at the sensor element(s). Therefore, also e.g. transmission of ultrasound by the sensor element(s) can be enhanced. Furthermore, the space for the interconnect on the front side of the sensor element is substantially reduced, e.g. a 25 micron soldered wire, as in the prior art, is replaced by e.g. 6 micron metalized PET carrier film.

Thus, an ultrasound friendly interconnect in size and materials is provided. In other words, the interconnect comprising a metalized carrier film and/or wire improves the front face of the sensor element(s), e.g. ultrasound transducer element, for acoustic properties and also reduces the space needed in front of the sensor element.

The additional soldering material on the transducer surface, as in the prior art, is avoided when replacing the soldered wire with the interconnect described herein. Also, the interconnect provides less detrimental acoustic influence or even enhance acoustic pressure output.

A sensor element used with an interconnect as describes herein, comprises a matching layer thickness of 20 to 100 micron. At a predetermined frequency, for example between 10-45 MHz, the thickness of the carrier can be part of the matching layer, or form entirely on its own the matching layer.

According to an example the metallic layer is provided at least on one side of the carrier film. By applying a metallic layer, e.g. Au provided at a thickness of less than 1 micron, on the carrier film an electrical connection for the sensor element is provided which does not influence the acoustic properties thereof.

According to an example the interconnect is configured to provide the electrical connection at least at a back side of the sensor. This provides a reduced dimension of the sensor, as less space is needed for the interconnect, maintaining its acoustic properties.

According to an example the carrier film is arranged at a front side of the sensor element and is configured to be wrapped around the side to the back side of the sensor element. The carrier film thus enables wrapping around the sensor element to bring the interconnect to the back side of the sensor element. Thus, attenuation caused by electrical connections at the front side of the sensor element (as in the prior art) is substantially reduced or diminished. Wrapping the thin metalized carrier film around the sensor element to bring the front side of the interconnect to the back side of the sensor element for electrical connection provides a sensor with improved acoustic properties. Furthermore, both the front and back carrier films can be connected by the same connection or same bonding process.

According to an example the metalized carrier film is provided as thin film or discrete film. A thin film comprises a carrier film, where metal layers and/or insulators are deposited by sputtering or evaporation. A discrete film comprises an organic film like PET (Mylar) or Polyimide (Kapton) as carrier for the metallic layer which is also applied by sputtering or evaporation.

According to an example the carrier film comprises a front part, a side part and a back part. This leads to improved flexibility for the arrangement of the interconnect at the sensor element. The front part is arranged at the front end of the sensor element and the back part is arranged at the back part of the sensor element. The different parts can differ in thickness and/or size.

All embodiments described later are based on the use of a single sided metalized film (carrier film). In examples the film comprises PET (Mylar) or Polypropylene or Polyimide (Kapton) with a thickness of a few microns. In examples the metallization is a thin layer of Au, Pt or Ag. Typical thickness of the metallization (metallic layer): 10 to 100 nanometer. The metal is applied by sputtering or evaporation.

According to an example the metallic layer is provided at the front part and/or at the back and/or at the side part facing away from the sensor element.

According to an example the back part of the carrier film is provided as separate part providing the metallic layer facing away from the sensor element.

According to an example the interconnect comprises two carrier films, arranged at the front side and at the back side of the sensor element, respectively. The two carrier films connecting the front side and the back side of the sensor can be connected to wires with the same bonding process at the back side of the sensor element. Comparative tests showed about 4 dB acoustic sensitivity improvement at the resonance peak around 12.5 MHz compared to prior art devices.

According to an example wires are bifilar wires. Both carrier films provide metallic coated surfaces at the connection surface, e.g. Au coated surfaced. Both wires, which are attached to the two carrier films, respectively, also provide plated surfaces at the contact with the films. In examples one carrier film is arranged on the back side of the sensor element covering the back side at least partially. The two wires—called bifilar wires—contain two copper or copper alloy wires. The metal cores are insulated and the two wires are bonded together with an epoxy. The wires are plated with about 1 micron Gold in order to get a reliable electrical contact. In examples one wire is attached on top of the film carrier, the other wire is directly bonded to the Gold plated surface of the sensor element. A droplet of adhesive (e.g. epoxy) on top of the wire connections can act as a strain relief.

According to an example the carrier film arranged at the front side of the sensor can be optionally attached to the front side for acoustical matching. For acoustic matching, the front part of the carrier film is provided with a larger thickness than the side part. The side part comprises a thickness suitable for bending alongside the sensor element. The thickness of the front part can be calculated based on the material of the carrier and frequency of the ultrasound sensor element. The thickness of the front part of the carrier optimally should be around the odd multiples of the wavelength of the acoustic wave at given frequency (do Nascimento et. al, Proceedings of the society of photo-optical instrumentation engineers (SPIE), Vol. 5035, pp. 86-96, 2003). As example, in case that the carrier material is Polyimide, then the thickness of the front side of the carrier should be around 49 micron for a central frequency of 12.5 MHz of the transducers, around 20 micron for a central frequency of 30 MHz and around 14 micron for a central frequency of 45 MHz (based on quarter wavelength).

According to the present invention, also a device comprising the sensor is provided. The device comprises a housing for receiving the sensor, wherein the interconnect of the sensor provides an electrical connection for the sensor.

The device comprises a medical interventional device including intravascular guidewire, catheters, interventional needles used for diagnosis and treatment. The device can also comprise a guide wire used in evaluating intermediate lesions, multi-vessel or multi-lesion disease, and restenosed lesions.

According to the present invention, also a method for manufacturing a sensor comprising a sensor element, an interconnect and a metallic layer is provided, comprising the following steps: providing the metallic layer at the interconnect and arranging the interconnect at the sensor element. The interconnect comprises at least a carrier film provided with the metallic layer and/or at least one wire provided with the metallic layer. The interconnect is configured to provide an electrical connection for the sensor element. The metallic layer is applied on the carrier film prior to the attachment of the interconnect at the sensor element.

According to an example the carrier film is arranged at a front side of the sensor element and is wrapped around the side to the back side of the sensor element. The carrier film provides a flexible material and a suitable thickness, at least of a side part thereof, so that wrapping is facilitated.

According to an example the carrier film and the wire are bonded to the sensor element with the same bonding process. The bonding is provided as low temperature bonding with a non conducting or conducting epoxy.

In examples the thickness of the film carrier is determined by the bending radius at the edges. If the film is too thick the metallic layer on the outside might rupture. If the film is too thin, the handling might be an issue, i.e. the use of the film might needs more care. A few microns, e.g. 2 to 7 microns, has been found a best suitable option for the thickness of the film carrier.

In other words, the invention provides an interconnect for a sensor element, e.g. transducer. Using a thin (6 micron) PET film, for example, which is metalized on one side with a thin layer of e.g. Au (less than 1 micron) an electrical connection can be made, which does not detrimentally influence the acoustic properties of the piezoelectric transducer. The thin metalized film can furthermore be wrapped around the transducer element for bringing the front side interconnect to the back side of the piezo element. The film(s) (bringing the front electrode connection to the back side of the transducer element) are connected to wires with the same bonding process at the back side of the ultrasound transducer element.

The interconnect according to the invention can be used for other type of sensors requiring front and back-side electrical connection, e.g. thermocouples, pressure sensors.

These and other aspects of the present invention will become apparent from and be elucidated with reference to the embodiments described hereinafter.

BRIEF DESCRIPTION OF THE DRAWINGS

Exemplary embodiments of the invention will be described in the following with reference to the following drawings:

FIG. 1A/1B a first embodiment of a sensor;
FIGS. 2A/2B, 3A/3B, 4A/4B, 5A/5B, further embodiments of a sensor;
FIGS. 6A/6B, 8A/8B, embodiments of the sensors resembling to prior art concept.
FIG. 7A/7B a flow chart for manufacturing of a sensor according to embodiment in FIG. 2A;
FIG. 11 a further flow chart for manufacturing of a sensor and assembly in a housing;
FIG. 12 a connection of a carrier film and wire of FIG. 11;
FIG. 13A-C connection of the carrier films and wires of FIG. 12;
FIG. 14A/14B a further embodiment of a sensor.

DETAILED DESCRIPTION OF EMBODIMENTS

Figure 10A:
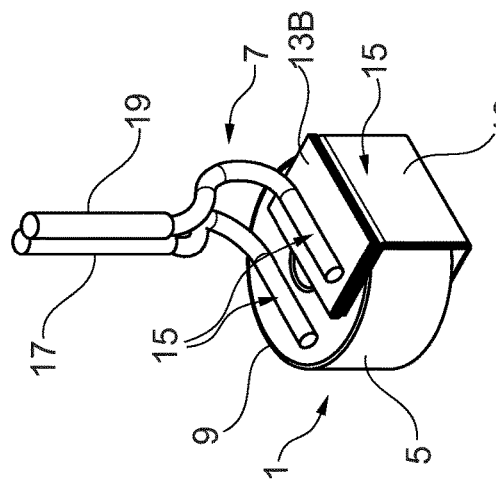
Figure 10B:
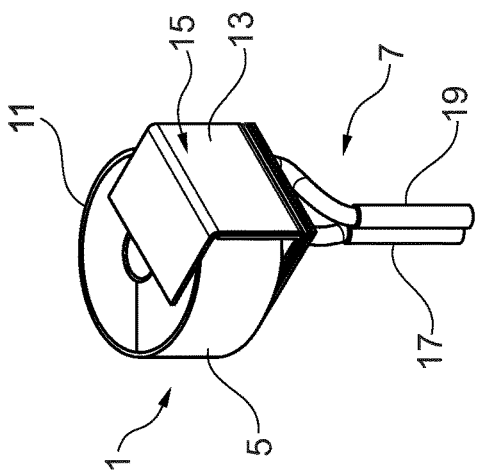

Certain embodiments will now be described in greater details with reference to the accompanying drawings. In the following description, like drawing reference numerals are used for like elements, even in different drawings. The matters defined in the description, such as detailed construction and elements, are provided to assist in a comprehensive understanding of the exemplary embodiments. Also, well-known functions or constructions are not described in detail since they would obscure the embodiments with unnecessary detail. Moreover, expressions such as "at least one of", when preceding a list of elements, modify the entire list of elements and do not modify the individual elements of the list.

FIGS. 1A/1B, 2A/2B, 3A/3B, 4A/4B, 5A/5B, 6A/6B, 7A/7B show exemplary and schematically embodiments of a sensor 1. The sensor 1 comprises a sensor element 5. FIGS. 1A-7A show a back side 9 of the sensor element 5. FIGS. 1B-7B show a front side 11 of the sensor element 5. The sensor 1 comprises an interconnect 7. The interconnect 7 is arranged at the sensor element 5 and comprises a carrier film 13 and/or a back wire 17 and/or a front wire 19 each provided with a metallic layer 15. The carrier film 13 comprises a front part 13F, a side part 13S and a back part 13B.

The front and back wire 17, 19 are provided with a bending, so that the end of the wires 17, 19 are substantially parallel to and above the back side 9 of the sensor element 5. The interconnect 7 provides an electrical connection for the sensor element 5.

In the figures the carrier film 13 (or its front part 13F and back part 13B) is bonded on the front side 11 and at the back side 9, respectively, with a non conducting thin double sided adhesive (not visible in the figures), if not otherwise specified.

In FIG. 1A/1B the metallic layer 15 is provided on the side of the carrier film 13 facing the sensor element 5. An insulating layer 16 is provided between the side part 13S and the sensor element 5, and between the back part 13B and the sensor element 5. The front part 13F of the carrier film 13 is arranged at the front side 11 of the sensor element 5.

The carrier film 13 is wrapped around the side to the back side 9 of the sensor element 5. The interconnect 7 attached at the front side 11 of the sensor element 5 is thus brought to the back side 9 of the sensor element 5.

The front wire 19 is provided with a metallic layer 15 comprising Au, Pt, Ag or other noble metals, at least in the region where the wire 19 is contacting the carrier film 13.

The electrical connection is provided by the front wire 19 attached to the back part 13B of the carrier film 13 and by the back wire 17 directly bonded to the back side 9 providing a metal plated surface 18 of the sensor element 5. The metal plated surface 18 of the back side 9 can comprise Au, Pt or other noble metals as for the metallic layer 15. The electrical connection is provided at the back side 9 of the sensor element 5.

In this embodiment the metalized carrier film 13 is provided as thin film.

In FIG. 2A/2B the metallic layer 15 is provided on the side of the carrier film 13 facing away from the sensor element 5. The metallic layer 15 is provided at the front part 13F, side part 13S and back part 13B facing away from the sensor element 5.

The front part 13F of the carrier film 13 is arranged at the front side 11 of the sensor element 5. Three parts are provided at the front side 11 of the sensor element 5: the front side 11 providing a metallization on the sensor element 5, front part 13F is bonded on the front side 11 with the metallic layer 15 facing up, so that no electrical connection is established between the metalized front side 11 and the front part 13F. In order to make the electrical connection a sheet of metallized film 13A is bonded with the metallic layer 15 facing towards the front side 11 and the front part 13F. The sheet of metallized film 13A partially overlays the front part 13F (the sheet of metallized film 13A is hatched differently for the overlaying region).

The carrier film 13 is wrapped around the side to the back side 9 of the sensor element 5. The interconnect 7 attached at the front side 11 of the sensor element 5 is thus brought to the back side 9 of the sensor element 5.

The front wire 19 is provided with a metallic layer 15 comprising Au, Pt, Ag or other noble metals, at least in the region where the wire 19 is contacting the back part 13B of the carrier film 13. The metallic layer 15 is facing the metalized wire 19 and it attached thereto providing an electrical connection. The back wire 17 is directly bonded to a metal plated surface 18 of the sensor element 5. The metal plated surface 18 can comprise Au, Pt or other noble metals as for the metallic layer 15. The electrical connection is provided at the back side 9 of the sensor element 5.

In this embodiment the metalized carrier film 13 is provided as discrete film.

The embodiment of FIG. 3A/3B is similar to FIG. 1A/1B except for the carrier film 13 which is provided as discrete film. The carrier film 13 (with metallic layer 15 on the inside) is folded around the sensor element 5. At the back side 9 the carrier film 13, i.e. the back part 13B of the carrier film 13, is folded back in order to bring the metallic layer 15 facing towards the wire 19 (facing away from the sensor element 5). At the front side 11, the front part 13F of the carrier film 13 is arranged partially covering the front side 11. The carrier film 13 (front part 13F and back part 13B) is bonded on the front side 11 and at the back side 9, respectively, with a non conducting thin double sided adhesive (not visible in the figures).

In FIG. 4A/4B another embodiment of a sensor 1 is shown comprising a discrete film as carrier film 13. The carrier film 13 is provided with a metallic layer 15 facing the sensor element 5.

An insulating layer 16 is provided between the back part 13B, the side part 13S and the sensor element 5. The front part 13F of the carrier film 13 is arranged at the front side 11 of the sensor element 5. The carrier film 13 is wrapped around the side to the back side 9 of the sensor element 5.

The interconnect 7 attached at the front side 11 of the sensor element 5 is thus brought to the back side 9 of the sensor element 5.

The front wire 19 is provided with a metallic layer 15 comprising Au, Pt, Ag or other noble metals, at least in the region where the wire 19 is contacting the carrier film 13. In this embodiment the front wire 19 is arranged between the insulating layer 16 and the back part 13B of the carrier film 13.

The electrical connection is provided by the front wire 19 attached to the back part 13B of the carrier film 13 and by the back wire 17 directly bonded to a metal plated surface 18 of the back side 9 of the sensor element 5. The metal plated surface 18 of the back side 9 can comprise Au, Pt or other noble metals as for the metallic layer 15. The electrical connection is provided at the back side 9 of the sensor element 5.

In FIG. 5A/5B another embodiment of a sensor 1 is shown comprising a discrete film as carrier film 13. The carrier film 13 is provided with a metallic layer 15 facing the sensor element 5.

The front part 13F of the carrier film 13 is arranged at the front side 11 of the sensor element 5 partially covering the front side 11. The carrier film 13 is wrapped around the side to the back side 9 of the sensor element 5. The back side 9 is partly provided with an additional metallized carrier film 13C with the metallic layer 15 facing outwards, i.e. away from the sensor element 5. Back part 13B of the carrier film 13 is bonded to the additional metallized film carrier 13C. Front wire 19 is also bonded on this metallized film carrier 13C.

The front wire 19 is provided with a metallic layer 15 comprising Au, Pt, Ag or other noble metals, at least in the region where the wire 19 is contacting the additional metallized carrier film 13C.

The electrical connection is provided by the front wire 19 attached to the additional metallized film carrier 13C and by the back wire 17 directly bonded to the back side 9 of the sensor element 5 provided with a metal plated surface 18. The back side 9 and/or the metal plated surface 9 can comprise Au, Pt or other noble metals as for the metallic layer 15. The electrical connection is provided at the back side 9 of the sensor element 5.

In FIG. 6A/6B a wire only interconnect 7 is shown. The interconnect 7 comprises the front wire 19 and the back wire 17. Both wires are provided with a metallic layer 15 at least in the region of connection to the sensor element 5.

The electrical connection is provided by directly bonding the wires 17, 19 to the respective back side 9 or front side 11.

FIG. 7A, 7B shows schematically a flow chart for manufacturing of a sensor 1. The flow chart shows the steps of arranging an interconnect 7 at the sensor element 5. In the last step (right side of the figure) the wires 17, 19 are provided.

The carrier film 13 is provided with a metallic layer 15 and is attached to a side of the sensor element 5, so that the metallic layer 15 is facing away from the sensor element 5. This is shown in FIG. 7A. The carrier film 13 is provided with an insulating material 20 on its side facing the sensor element 5.

From left to right the subsequent steps for the wrapping of the carrier film 13 is shown. After arranging the carrier film 13 on the side of the sensor element 5, the back part 13B and the front part 13F are folded towards the respective back side 9 and front side 11 of the sensor element 5. The back side 9 and the front side 11 are provided with a metal surface 18.

The front part 13F is not electrically connected to the front side 11. In order to make an electrical connection a discrete film 13A (see also FIG. 2A, sheet of metallized film 13A) with a metallic layer 15 facing the sensor element 5 is applied at the front side 11 of the sensor element 5. The metallic layer 15 of the discrete film 13A provides the electrical connection. The discrete film 13A partially overlays the front part 13F (discrete film 13A is hatched differently for the overlaying region).

The metalized front wire 19 is then connected to the carrier film 13, i.e. the back part 13B, at the back side 9 of the sensor element 5. The back wire 17 is connected to the back side 9.

Figure 8A:
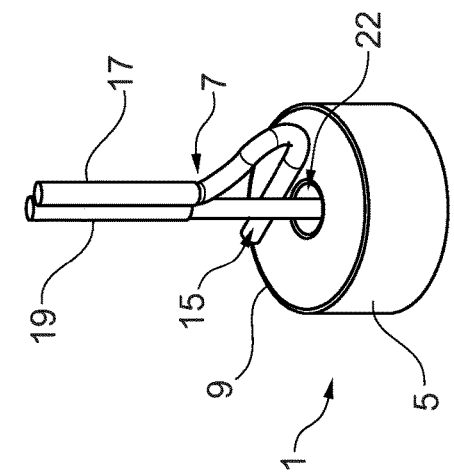
Figure 8B:
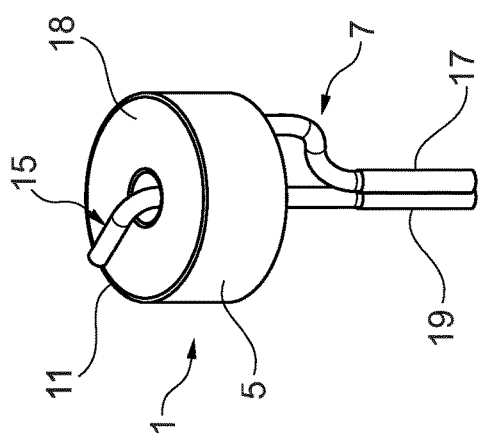

FIGS. 8A/8B, 9A/9B, 10A/10B show schematically and exemplarily further embodiments of a sensor 1. The sensor 1 comprises a sensor element 5 provided as ceramic disk. At the front side 11 of the sensor element 5 a metal plated surface 18 can comprise Au, Pt or other noble metals as for the metallic layer 15.

In FIG. 8A/8B the sensor element 5 is provided with a hole 22 for the front wire 19 to run through. The electrical connection is provided at the front side 11 by attachment of the metallized front wire 19 (provided with a metallic layer 15) to the metal plated surface 18. At the back side 9 of the sensor element 5, the metalized back wire 17 is bonded to the surface of the sensor element 5.

Figure 9A:
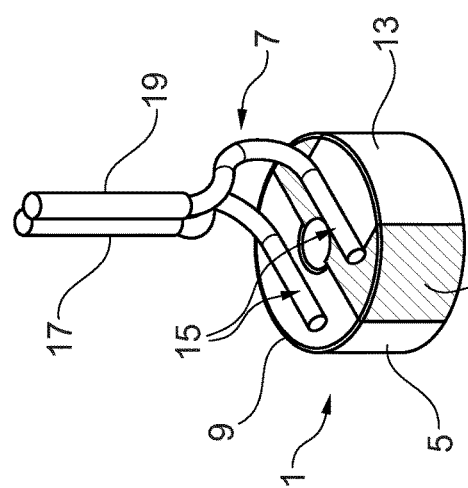
FIGS. 9A/9B, 10A/10B further embodiments of a sensor.
Figure 9B:
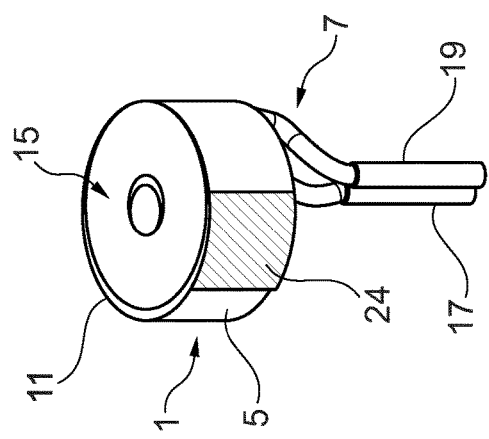

In FIG. 9A/9B an alternative embodiment is shown. The wires 17, 19 are connected (e.g. ultrasound bonding) on the back side 9 of the sensor element 5 and connected via a thin film process (like depositing oxide and metal layers) as carrier film 13 to the front side 11 of the sensor element 5. A non-conductive section 24 is provided for establishing the electrical insulation FIG. 10A/10B shows a further embodiment of a sensor 1, where the wires 17, 19 are connected on the back side 9 of the sensor element 5. A discrete film as carrier film 13 is provided with a metallic layer 15. The carrier film 13 is wrapped around a side of the sensor element 5. The back part 13B of the carrier film is folded back at the back side 9 of the sensor element 5 to bring the metallic layer 15 towards back wire 19.

FIG. 11 shows a further flow chart for manufacturing of a sensor 1. A sensor element 5 provides a back side 9 and a front side 11. Two carrier films 13 are attached to the front side 11 and the back side 9 of the sensor element 5. The carrier films 13 are single sided metalized films 13 (metallic layer 15) which are bonded and wrapped around the sensor element 5, so that both carrier films 13 are at the back of the sensor element 5. The carrier films 13 are connected to bifilar wires 31, 33.

The sensor 1 is received in a housing 21 of a guide wire, for example. The housing can be attached or integrated in an interventional medical device, e.g. guidewire, catheter, needle.

FIG. 12 shows exemplarily a connection of the interconnect 7 of a sensor 1 and bifilar wires 31, 33 of FIG. 11.

The interconnect 7 comprises two carrier films 13, where the carrier film 13 attached to the front side 11 of the sensor element 5 is wrapped around a side of the sensor element 5. The carrier film 13 attached to the back side 9 of the sensor element 5 is folded in such a manner, that the two carrier films 13 are facing each other.

Bifilar wires 31 and 33 are based on bonding under pressure with Au plated surfaces 15 on both carrier films 13 and wires 31, 33. For enabling easy bonding of the wires to the carrier film 13, the wires are provided in a crossing manner, which is more evident from FIGS. 13A-C.

FIGS. 13A-C show the connection of the carrier films 13 and wires 31, 33 of FIG. 12 in more detail. FIG. 13A shows a top view of the carrier film 13 and the wires 31, 33. The metalized end of wire 31 is provided with a bend 35.

From FIG. 13B it is apparent that the end of the other wire 33 is also provided with a bend 35 in the opposite direction. This is also apparent from top view of FIG. 13C.

FIG. 14A/14B shows a further embodiment of a sensor 1 as an alternative embodiment, which enables having a shorter sensor assembly length.

A sensor element 5 is provided with an interconnect 7 comprising two carrier films 13. The carrier films 13 are provided with a metallic layer 15 on one side. An adhesive layer 34 is provided partially on the carrier films 13. The carrier films 13 are folded or wrapped around a side of the sensor element 5 (more apparent from FIG. 14B) resulting as sensor 1 with an electrical connection at the back side 9 thereof.

FIG. 14B shows the assembly of sensor 1 in a side view. The carrier films 13 are attached to the sensor element 5 by an adhesive layer 34. The lower carrier film 13 in FIG. 14B is folded towards the sensor element 5 so that the adhesive layer 34 connects the film carrier 13 and the sensor element 5. The other carrier film 13, upper film 13 in FIG. 14B, is also folded in the same direction as the lower film 13, so that the adhesive layer 34 of the lower film 13 can be attached to the upper film 13. The folding angles are rectangular.

The finally assembled sensor 1 provides an interconnect 7 with two carrier films 13 attached to each other by an adhesive layer 34. The adhesive layer 34 between the carrier films 13 is provided in the vicinity of the sensor element 5. The two ends of the carrier films 13 facing away from the sensor element 5 can be connected to wires for electrical connection of the sensor 1.

Figure 15:
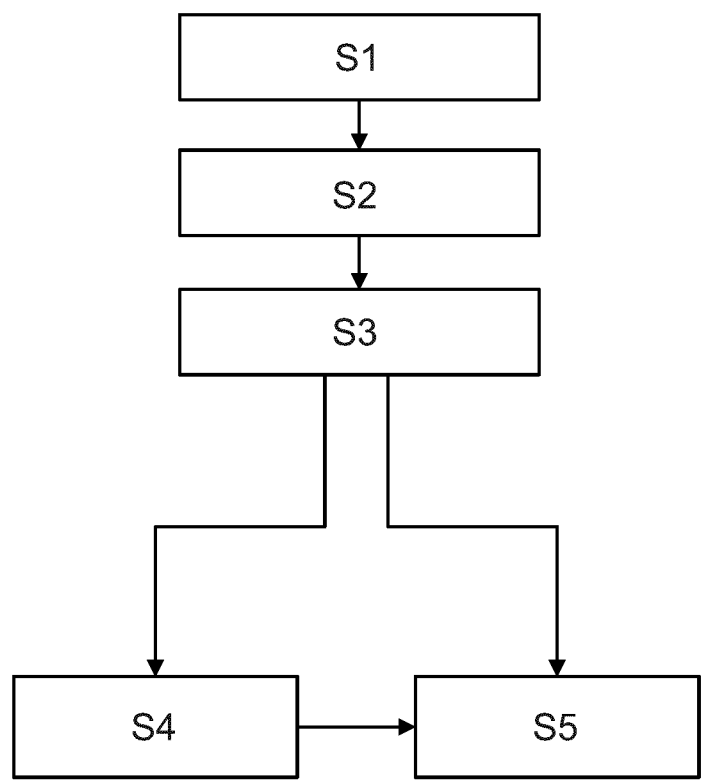
FIG. 15 a flow chart of a method for manufacturing of a sensor.
Figure 16A:
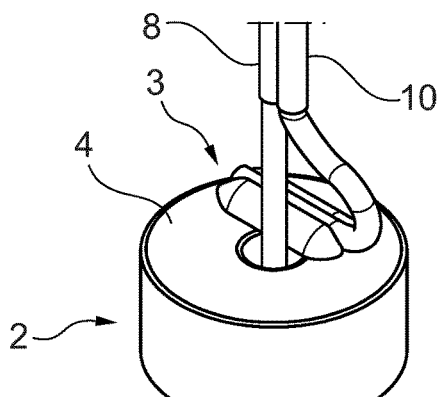
FIG. 16A-C a prior art embodiment.
Figure 16B:
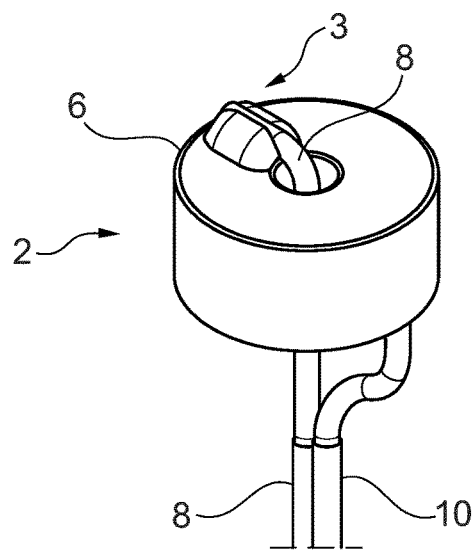
Figure 16C:
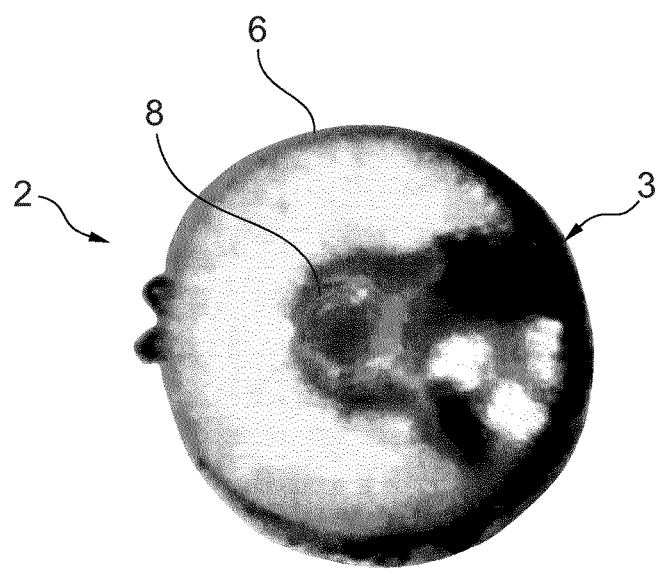

FIG. 15 shows a flow chart of a method for manufacturing of a sensor 1 comprising a sensor element 5, an interconnect 1 and a metallic layer 15.

The method comprises providing S1 the metallic layer 15 at the interconnect 7, wherein the interconnect 7 comprises at least a carrier film 13 provided with the metallic layer 15 and/or at least one wire 17, 19 provided with the metallic layer 15.

The interconnect 7 is arranged S2 at the sensor element 5, wherein the interconnect 7 is configured to provide an electrical connection for the sensor element 5.

In embodiments the carrier film 13 is arranged S3 at a front side 11 of the sensor element 5 and is wrapped S4 around the side to the back side 9 of the sensor element 5. The carrier film 13 and the wire 17, 19 are bonded S5 to the sensor element 5 with the same bonding process.

It has to be noted that embodiments of the invention are described with reference to different subject matters. In particular, some embodiments are described with reference to method type claims whereas other embodiments are described with reference to the device type claims. However, a person skilled in the art will gather from the above and the following description that, unless otherwise notified, in addition to any combination of features belonging to one type of subject matter also any combination between features relating to different subject matters is considered to be disclosed with this application. However, all features can be combined providing synergetic effects that are more than the simple summation of the features.

While the invention has been illustrated, and described in detail in the drawings and foregoing description, such illustration and description are to be considered illustrative or exemplary and not restrictive. The invention is not limited to the disclosed embodiments. Other variations to the disclosed embodiments can be understood and effected by those skilled in the art in practicing a claimed invention, from a study of the drawings, the disclosure, and the dependent claims.

In the claims, the word "comprising" does not exclude other elements or steps, and the indefinite article "a" or "an" does not exclude a plurality. A single processor or other unit may fulfil the functions of several items re-cited in the claims. The mere fact that certain measures are re-cited in mutually different dependent claims does not indicate that a combination of these measures cannot be used to advantage. Any reference signs in the claims should not be construed as limiting the scope.

The invention claimed is:

1. A sensor, comprising:
    a sensor element with two opposite sides and a lateral side;
    an interconnect comprising an electrically insulating flexible carrier configured for electrical conduction, wherein the carrier comprises two terminal segments at two opposite sides of a central segment, wherein the first of the two terminal segments is folded over the first side of the two opposite sides of the sensor element, wherein the central segment of the carrier is located adjacent to the lateral side of the sensor element and the second of the two terminal segments is folded over the second side of the two opposite sides of the sensor element,
    wherein the carrier is configured to transmit an electrical signal from a first electrode comprised on the first side of the sensor element to the second side of the sensor element to provide an electrical connection of the first electrode from the second side of the sensor element.

2. The sensor of claim 1, wherein the second side of the sensor element comprises a second electrode, and wherein the sensor element is contactable for both, first and second electrodes from the second side of the sensor element.

3. The sensor of claim 1, wherein the sensor comprises a further interconnect in electrical connection with the second electrode, and wherein the first and second electrodes are contactable trough the two respective interconnects.

4. The sensor of claim 3, further comprising a bifilar electrical conductor, wherein each of the interconnects is in electrical connection with one of the conductors of the bifilar electrical conductor.

5. The sensor of claim 4, wherein a portion of the two interconnects are attached to each other to form a composite interconnect extending from the second side of the sensor element, and wherein each of the electrical conductor of the bifilar electrical conductor is electrically connected on opposite sides of the composite interconnect.

6. The sensor of claim 1, wherein the sensor element is an ultrasound sensor element, wherein the first side of the ultrasound sensor is configured for acoustical matching for emission and reception of ultrasound waves to and from anatomical media, and wherein the second side of the ultrasound transducer is provided with electrically conductive ultrasound attenuating material.

7. The sensor of claim 6, wherein the acoustical matching at least partially comprises the first terminal segment of the flexible carrier.

8. The sensor of claim 7, wherein the thickness of the first terminal segment of the flexible carrier provides the entire acoustical matching for a predetermined central frequency of the ultrasound sensor element.

9. The sensor of claim 7, wherein the first terminal segment of the flexible carrier is thicker than the central segment.

10. The sensor of claim 6, wherein the central frequency is above 10 MHz.

11. The sensor of claim 1, wherein the flexible carrier comprises one of the materials: polyethylene terephthalate, polypropylene and polyimide.

12. An interventional medical device, comprising:
    a sensor according to claim 1;
    a housing for receiving the sensor; and
    an elongate body to which the housing is attached.

* * * * *